United States Patent
Darolia et al.

(10) Patent No.: US 6,808,799 B2
(45) Date of Patent: Oct. 26, 2004

(54) THERMAL BARRIER COATING ON A SURFACE

(75) Inventors: Ramgopal Darolia, West Chester, OH (US); Boris A. Movchan, Kyiv (UA); Yuriy E. Rudoy, Kyiv (UA); Leonella M. Nerodenko, Kyiv (UA); Irene Spitsberg, Loveland, OH (US); David John Wortman, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 102 days.

(21) Appl. No.: 10/064,785

(22) Filed: Aug. 16, 2002

(65) Prior Publication Data

US 2003/0129316 A1 Jul. 10, 2003

(51) Int. Cl.$^7$ ............................................. B32B 3/26
(52) U.S. Cl. ............................. 428/305.5; 428/307.3; 428/307.7; 428/314.4; 428/319.1; 428/689; 428/697; 428/698; 428/699; 428/701; 428/702
(58) Field of Search ..................... 428/305.5, 307.3, 428/307.7, 314.4, 319.1, 689, 697, 698, 699, 701, 702

(56) References Cited

U.S. PATENT DOCUMENTS

| 4,599,270 | A | 7/1986 | Rangswamy et al. ....... 428/402 |
|---|---|---|---|
| 5,296,274 | A | 3/1994 | Movchan et al. ........ 427/274 X |
| 5,418,003 | A | 5/1995 | Bruce et al. ................. 427/566 |
| 5,683,825 | A | 11/1997 | Bruce et al. ................ 428/698 |
| 5,906,895 | A | 5/1999 | Hamada et al. ............. 428/610 |
| 5,939,147 | A | 8/1999 | Jones ......................... 427/453 |
| 6,312,832 | B1 | 11/2001 | Alperine et al. ............ 428/633 |

FOREIGN PATENT DOCUMENTS

EP  166097  1/1986 ............. C23C/4/10

OTHER PUBLICATIONS

P.G. Klemens, *Thermal Conductivity of Zirconia*, Thermal Conductivity 23 (1996), K.E. Wilks et al., ed., Lancaster, PA, p. 209–220, no month avail.

*Primary Examiner*—Bernard Pianalto
(74) *Attorney, Agent, or Firm*—David L. Narciso; Gary M. Hartman; Domenica N.S. Hartman

(57) ABSTRACT

A thermal barrier coating, or TBC (26), and method for forming the TBC (26). The TBC (26) is formed of a thermal-insulating material that contains yttria-stabilized zirconia (YSZ) alloyed with at least a third oxide. The TBC (26) is formed to also contain elemental carbon, and may potentially contain carbides and/or a carbon-containing gas that forms from the thermal decomposition of carbon. The TBC (26) is characterized by lower density and thermal conductivity, high temperature stability and improved mechanical properties. To exhibit the desired effect, the third oxide is more particularly one that increases the lattice strain energy of the TBC microstructure as a result of having an ion size that is sufficiently different than a zirconium ion.

15 Claims, 2 Drawing Sheets

THERMAL BARRIER COATING ON A SURFACE

BACKGROUND OF INVENTION

1. Field of the Invention

This invention relates to thermal-insulating coatings for components exposed to high temperatures, such as the hostile thermal environment of a gas turbine engine. More particularly, this invention is directed to a thermal barrier coating (TBC) containing elemental carbon and/or carbides in yttria-stabilized zirconia that has been alloyed with at least a third oxide to increase the lattice strain energy of the TBC grains. The resulting TBC is characterized by lower density and thermal conductivity, high temperature stability, and improved mechanical properties from a hardening effect between carbon and the third oxide.

2. Description of the Related Art

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack, and as a result may not retain adequate mechanical properties. For this reason, these components are often protected by a thermal barrier coating (TBC) system. TBC systems typically include an environmentally-protective bond coat and a thermal-insulating topcoat, typically referred to as the TBC. Bond coat materials widely used in TBC systems include oxidation-resistant overlay coatings such as MCrAlX (where M is iron, cobalt and/or nickel, and X is yttrium or another rare earth or reactive element), and oxidation-resistant diffusion coatings such as diffusion aluminides that contain nickel-aluminum (NiAl) intermetallics.

TBC materials are typically ceramic materials and particularly zirconia ($ZrO_2$) that is partially or fully stabilized by yttria ($Y_2O_3$), magnesia (MgO), ceria ($CeO_2$), calcia (CaO), scandia ($Sc_2O_3$) or other oxides. Binary yttria-stabilized zirconia (YSZ) is widely used as a TBC material because of its high temperature capability, low thermal conductivity and erosion resistance in comparison to zirconia stabilized by other oxides, e.g., ceria-stabilized zirconia, which exhibits poorer erosion resistance as a result of being relatively soft. YSZ is also preferred as a result of the relative ease with which it can be deposited by plasma spraying, flame spraying and physical vapor deposition (PVD) techniques. In plasma spraying processes, the coating material is typically in the form of a powder that is melted by a plasma as it leaves a spray gun. As a result, a plasma-sprayed TBC is formed by a buildup of molten "splats" and has a microstructure characterized by irregular flattened grains and a degree of inhomogeneity and porosity. TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

In order for a TBC to remain effective throughout the planned life cycle of the component it protects, it is important that the TBC has and maintains a low thermal conductivity throughout the life of the component, including during high temperature excursions. However, the thermal conductivities of TBC materials such as YSZ are known to increase over time when subjected to the operating environment of a gas turbine engine. As a result, TBC's for gas turbine engine components are often deposited to a greater thickness than would otherwise be necessary. Alternatively, internally cooled components such as blades and nozzles must be designed to have higher cooling flow. Both of these solutions are undesirable for reasons relating to cost, component life and engine efficiency. As a result, it can be appreciated that further improvements in TBC technology are desirable, particularly as TBC's are employed to thermally insulate components intended for more demanding engine designs.

U.S. Pat. No. 5,906,895 to Hamada et al. discloses a method of inhibiting the deterioration of the thermal properties of a TBC by suppressing a reaction sintering mechanism said to occur in TBC's at high temperatures. In Hamada et al., a high temperature compound (such as a carbide, nitride or another high temperature material) is said to be compounded into a YSZ TBC deposited by a plasma spraying process. According to three plasma spraying techniques disclosed by Hamada et al., the high temperature compound appears to be present as splats dispersed within the TBC as a result of the plasma spraying process. According to a fourth technique disclosed by Hamada et al., a plasma-sprayed TBC is infiltrated with a feed gas of the high temperature compound, apparently forming a coating of the compound on the inter-splat boundaries of the porous TBC. Following this treatment, any remaining feed gas would inherently escape the TBC through the same passages that allowed the gas to infiltrate the TBC. With each approach, the high temperature compound is said to suppress reaction sintering of the YSZ TBC by some unexplained mechanism.

In commonly-assigned U.S. Pat. No. 6,492,038 to Rigney et al., a more thermally-stable TBC is achieved by inhibiting grain growth (coarsening), sintering, and pore redistribution (the coalescence or coarsening of smaller pores to form larger pores) during high temperature excursions. According to Rigney et al., resistance to heat transfer through a TBC is determined in part by the amount of microstructural defects within the grains of the TBC. Rigney et al. teach that such defects can be created by composition-induced defect reactions and process-induced porosity, the former of which includes vacancies that result from the need in ionic solids to maintain charge neutrality, as is the case in YSZ where substitution of zirconia ($ZrO_2$) with yttria ($Y_2O_3$) in the lattice yields a vacancy. On the other hand, process-induced porosity includes pore formation that occurs during coating as a component is rotated relative to the deposition source. A primary example is the "sunrise-sunset" vapor-surface mechanisms that occur during rotation of a component during deposition of TBC from a vapor cloud, such as by PVD, the result of which is a textured growth of the deposit in which pores are formed between columns, within the columns, and between secondary growth arms contained within the columns.

Rigney et al. teach a technique by which process-induced porosity in a TBC is preserved by incorporating extremely fine precipitates into the TBC microstructure. More particularly, Rigney et al. teach that limited amounts of extremely fine carbide and/or nitride precipitates formed at the defects, pores and grain boundaries of the TBC microstructure serve to pin the TBC grain boundaries to inhibit sintering, grain coarsening, and pore redistribution during high temperature excursions, with the effect that the microstructure, and consequently the thermal conductivity of the TBC, is stabilized. Rigney et al. teach that suitable carbiding/nitriding techniques include depositing the TBC using a physical vapor deposition technique in an atmosphere that contains carbon and/or nitrogen vapors, gases or compounds, and/or heat-treating in the presence of a gas containing carbon and/or nitrogen gases or compounds. Contrary to Hamada et al., the carbide/nitride precipitates must be incorporated as extremely fine precipitates in order to pin the TBC grain boundaries.

While the incorporation of carbide/nitride precipitates in accordance with Rigney et al. makes possible a more stabilized TBC microstructures, further improvements in TBC microstructure and processes would be desirable.

SUMMARY OF INVENTION

The present invention generally provides a thermal barrier coating (TBC) and method for forming the coating on a component intended for use in a hostile environment, such as the superalloy turbine, combustor and augmentor components of a gas turbine engine. The method of this invention is particularly directed to producing a TBC characterized by lower density and thermal conductivity, high temperature stability, and improved mechanical properties. Improvements obtained by this invention are particularly evident with TBC having a columnar grain structure, such as those deposited by EBPVD and other PVD techniques, though the invention is also applicable to TBC deposited by such methods as plasma spraying.

The invention generally entails a TBC formed of a thermal-insulating material that contains yttria-stabilized zirconia (YSZ) alloyed with at least a third oxide. The TBC is formed to also contain elemental carbon, and may potentially contain carbides and/or a carbon-containing gas that forms from the thermal decomposition of carbon. According to the invention, the TBC is characterized by lower density and thermal conductivity, high temperature stability and improved mechanical properties. To exhibit the desired effect, the third oxide is more particularly one that increases the lattice strain energy of the TBC microstructure as a result of having an ion size that is sufficiently different from a zirconium ion ($Zr^{4+}$). While not wishing to be held to any particular theory, increased strain energies are believed to act as scattering sites for lattice vibrations (phonons) that contribute to the thermal conductivity of YSZ. It is believed that metal oxides having an absolute percent ion size difference relative to zirconium ions of at least that of the yttrium anion ($Y^{3+}$), i.e., at least 13 percent, are effective to produce significant strains due to ionic size. Oxides of metals such as cerium, gadolinium, neodymium, lanthanum, dysprosium, tantalum, magnesium, calcium, strontium and barium meet this requirement, a particular example being ceria ($CeO_2$) which has an absolute percent ion size difference relative to zirconium ions of about 30 percent. However, ceria additions to YSZ are known to have the undesirable effect of increasing coating density and reducing erosion resistance. In the present invention, it has been unexpectedly shown that a ceria-modified YSZ coating that is further modified by doping with carbon undergoes hardening during thermal aging as an apparent result of a reaction that occurs between ceria and the elemental carbon present in the TBC. Advantageously, density of the coating is also decreased due to the carbon content forming small and stable pores when the coating is sufficiently heated.

Other objects and advantages of this invention will be better appreciated from the following detailed description.

DETAILED DESCRIPTION

Figure 1:
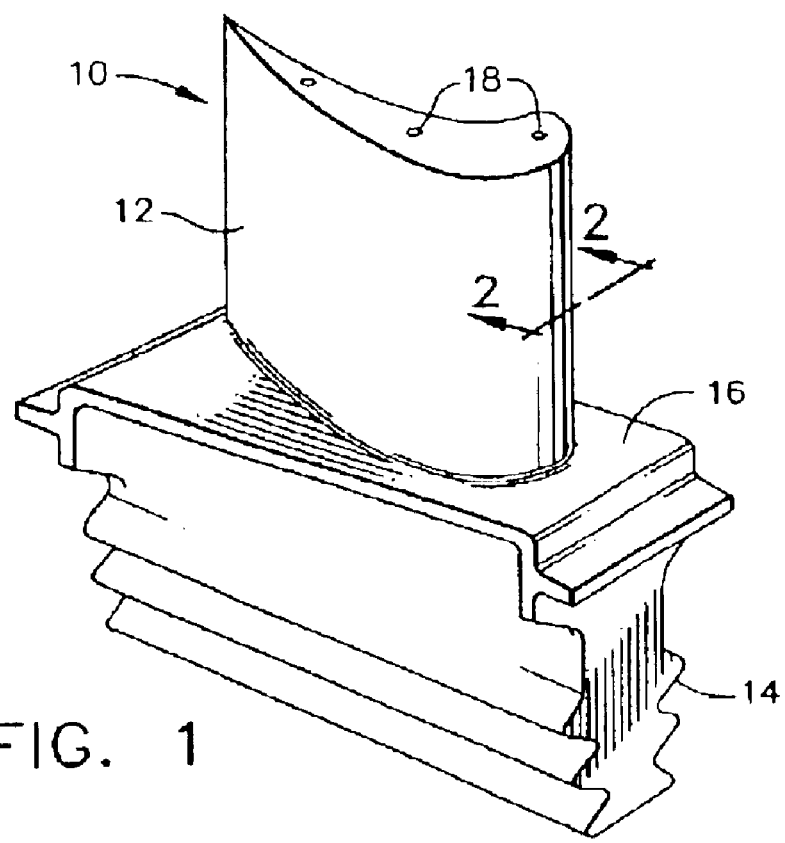
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
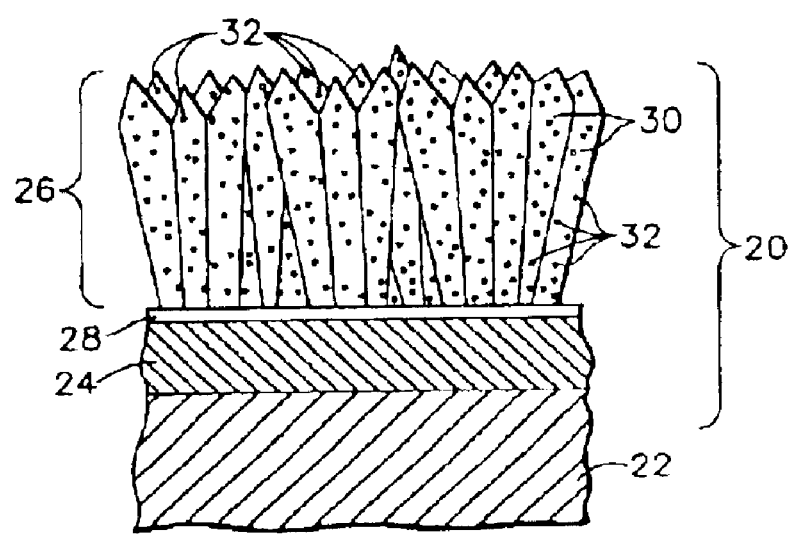
FIG. 2 schematically represents a cross-sectional view of the blade of FIG. 1 along line 2—2, and shows a thermal barrier coating system on the blade in accordance with the invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is preferably an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a TBC 26, formed of a thermal-insulating material, to the bond coat 24 and substrate 22. The TBC 26 of FIG. 2 is represented as having a strain-tolerant microstructure of columnar grains 30. As known in the art, such columnar microstructures can be achieved by depositing the TBC 26 using a physical vapor deposition technique, such as EBPVD. While much of the following discussion will focus on columnar TBC of the type represented by FIG. 2, the invention is also believed to be applicable to noncolumnar TBC deposited by such methods as plasma spraying, including air plasma spraying (APS). A TBC of this type is in the form of molten "splats," resulting in a microstructure characterized by irregular flattened grains and a degree of inhomogeneity and porosity.

As with prior art TBC's, the TBC 26 of this invention is intended to be deposited to a thickness that is sufficient to provide the required thermal protection for the underlying substrate 22 and blade 10, generally on the order of about 75 to about 300 micrometers. As a result of the processes by which the TBC 26 is deposited, the individual grains 30 of the TBC 26 are characterized by microstructural defects and pores 32 within the grains 30 and at and between the grain boundaries. The defects and pores 32 are believed to decrease the thermal conductivity of a TBC grain 30, and therefore the TBC 26 as a whole. The TBC 26 of the present invention is provided with reduced thermal conductivity as a result of its composition.

According to the invention, the thermal-insulating material of the TBC 26 is based on binary yttria-stabilized zirconia (YSZ), but alloyed to contain at least a third metal oxide. The thermal-insulating material preferably contains about 4 to about 8 weight percent yttria, though lesser or greater amounts of yttria could be used. According to one aspect of the invention, the third oxide has an absolute percent ion size difference relative to zirconium ions of at least that of an yttrium anion ($Y^{3+}$), i.e., at least 13 percent, so as to produce significant strains due to ionic size. According to a second aspect of the invention, the thermal-insulating material of the TBC 26 is further modified to contain elemental carbon in the form of precipitate clusters, from which may evolve a carbon-containing gas (e.g., carbon monoxide (CO) and/or carbon dioxide ($CO_2$)) as a result of thermal decomposition of carbon. In combination, the presence of elemental carbon clusters and the above-specified third metal oxide has been shown to reduce the density and thermal conductivity of a YSZ TBC.

The third metal oxide is preferably ceria ($CeO_2$), which has an absolute percent ion size difference relative to zirconium ions of about 30 percent. However, it is believed that other or additional oxides that meet the ion size requirement of this invention could be used, examples of which are gadolinium oxide ($Gd_2O_3$), neodymia ($Nd_2O_3$), lanthana ($La_2O_3$), dysprosia ($Dy_2O_3$), tantala ($Ta_2O_5$). magnesia (MgO), calcia (CaO), strontia (SrO) and barium oxide (BaO). A notable exception to the ion size requirement is ytterbia ($Yb_2O_3$), which has an ion size difference of 9%, but appears to have a sufficiently high ionic mass to achieve similar reductions in thermal conductivity when combined with elemental carbon in YSZ. Based on an investigation discussed below, ceria in amounts of about 10 to about 20 weight percent of the thermal-insulating material is believed to have the beneficial effect of increasing lattice strain energy to the extent that thermal conductivity of the TBC 26 is reduced by about 10%. It is foreseeable that higher levels of ceria could be used, e.g., up to about thirty weight percent, though with the disadvantage of increasing density of the TBC 26. It is also foreseeable that lower levels of ceria could be used, e.g., as little as about one weight percent, but with a corresponding reduced effect on thermal conductivity. The increased strain energy caused by ion size difference of the third oxide is believed to act as scattering sites for lattice vibrations (phonons), which contribute to the thermal conductivity of YSZ. It is therefore believed that those metal oxides noted above as producing high strains due to ionic size would also be effective if present in sufficient amounts. These oxides are summarized in Table I below with their absolute percent ion size difference relative to zirconium ions.

TABLE I

| Oxide | % Ion Size Difference |
|---|---|
| MgO | 16 |
| CaO | −25 |
| SrO | −42 |
| BaO | −70 |
| $La_2O_3$ | −34 |
| $CeO_2$ | −30 |
| $Nd_2O_3$ | −27 |
| $Gd_2O_3$ | 19 |
| $Dy_2O_3$ | −15 |
| $Yb_2O3$ | −9 |
| $Ta_2O5$ | −13 |

Magnesia, calcia, strontia and barium oxide are alkaline-earth metal oxides, while lanthana, ceria, neodymia, gadolinium oxide, dysprosia and ytterbia are rare-earth metal oxides. While alkaline-earth metal oxides and rare-earth metal oxides have been used in the past to stabilize zirconia, the present invention makes use of these oxides in combination with elemental carbon for reasons discussed below.

A first beneficial effect of elemental carbon is believed to be through an increase in the amount of porosity within the TBC 26 during the coating operation, and then a stabilization of the porosity and even an increase in porosity during subsequent high temperature excursions as a result of the carbon thermally decomposing to yield the carbon-containing gas. Such an effect is particularly important if the third oxide is heavier than yttria (e.g., ceria at about 7.65 g/cc vs. yttria at about 4.84 g/cc) and therefore may have the effect of increasing the density and weight of the TBC 26.

If the third oxide is ceria, the presence of elemental carbon in the TBC 26 has been determined to provide the additional benefit of hardening the TBC 26. In particular, ceria-stabilized zirconia is known to have relatively poor erosion resistance as a result of ceria being relatively soft (e.g., a microhardness of 1.8 to 2.4 GPa versus 4.4 to 4.6 GPa for YSZ). The deposition and/or presence of carbon in the TBC 26 has been shown provide for a reaction with ceria at elevated temperatures that yields precipitates of carbides and oxycarbides (e.g., $ZrO_xC_y$), producing a hardening effect. The hardening effect is believed to occur during deposition of the TBC 26 at temperatures of about 900° C. to about 1000° C. under appropriate conditions, or during a post-deposition thermal aging treatment in the same temperature range. While not wishing to be held to any particular theory, a reaction between carbon and ceria is believed to occur as a result of ceria vapor being highly reactive with carbon vapor, both of which exist if the TBC 26 is deposited by PVD, such as EBPVD. The reactivity of ceria with carbon is significantly greater than that of zirconia with carbon (discussed in greater detail below), and therefore provides a mechanism by which carbon in the form of carbides can be co-deposited or subsequently evolved. If this theory is correct, one or more of the oxides listed above as increasing lattice strain energy may also react with carbon for the same reason, thereby benefitting from a similar hardening effect.

A preferred method for co-depositing carbon and the thermal-insulating material of the TBC 26 is by the simultaneous evaporation of a suitable source of carbon and YSZ alloyed with ceria, which may be combined in a single ingot or provided in separate ingots. An example of a suitable carbon source is graphite, though carbon in the form of a compound could also be used, such as zirconium carbide (ZrC), titanium carbide (TiC), tantalum carbide (TaC), and molybdenum carbide ($Mo_2C$). The desirable added porosity discussed previously is believed to be the result of a shadowing effect that occurs when two insoluble phases are deposited by EBPVD. More particularly, "primary" porosity is believed to be created surrounding deposited elemental carbon clusters (and possibly clusters of carbides, oxycarbides, etc., all of which are insoluble in YSZ) during EBPVD as a result of zirconia vapor flux being blocked from the immediate vicinity of the second phase clusters. Another benefit of co-deposition of carbon clusters (and possibly carbide clusters) by EBPVD has been observed to be the formation of many additional interfaces associated with sub-grain boundaries, possibly due to what appears to be related to the presence of carbon promoting the nucleation of new sub-grains and inhibiting diffusion processes of grain growth. The result is a continuous nucleation of new grains, which produces a fine sub-grained TBC structure with numerous interfaces that reduce thermal conductivity through the TBC grains. Open porosity levels observed within TBC deposited in accordance with this invention are well in excess of YSZ TBC deposited from an identical YSZ source material (minus the carbon source) under identical conditions. While YSZ TBC is typically deposited by EBPVD to have open porosity levels of not more than about 15 to 20 volume percent, open porosity levels on the order of about 30 volume percent are believed to be possible with the present invention, with typical open porosity levels being about 30 to about 35 volume percent.

Fine "secondary" porosity occurs with this invention as a result of elemental carbon (and possibly carbides) reacting with oxygen to form carbon monoxide and/or another carbon-containing gas (e.g., carbon dioxide) during high temperature excursions (e.g., above about 950° C.). As a result of the primary porosity surrounding the deposited carbon, there is sufficient pore volume for carbon-containing gases to evolve and produce very fine pores ("micropores") within the TBC 26. As these gases form and some of the original primary porosity is lost as a result of shrinkage of smaller pores and growth of larger pores at the expense of smaller pores (pore coarsening and redistribution) during sintering, some of the gases are entrapped within the micropores. The entrapped gases are believed to counteract surface tension energies that are the driving force for the shrinkage of small pores during sintering. Therefore, in addition to reducing the density and thermal conductivity of the TBC 26, the added fine porosity made possible with this invention is thermally stable, i.e., less susceptible to shrinkage.

Additional porosity may also be generated in part through one or both of the following reactions:

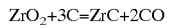

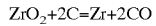

These reactions have been reported in the art as occurring within a temperature range of about 900° C. to about 1200° C. if a sufficiently low vacuum of about $10^{-4}$ to $10^{-5}$ Torr (about $1.33 \times 10^{-4}$ to $1.33 \times 10^{-5}$ mbar) is maintained (because the equilibrium pressure of carbon monoxide is very low, e.g., about $10^{-4}$ Torr at 870° C.). According to this theory, zirconium and zirconium carbide would form during deposition by EBPVD under these conditions, and primary porosity would also form around these particles as a result of the shadowing effect during the EBPVD process. During subsequent heating, gaseous carbon monoxide would then form, resulting in new secondary porosity within the TBC 26 and its grains 30, as well as carbon monoxide (and/or carbon dioxide or another carbon-containing gas) entrapped within micropores that are remnants of the original primary porosity (i.e., pores 32). Carbides (e.g., ZrC) and oxycarbides are also potential byproducts of the above reactions, and may serve to stabilize the micropore structure of the TBC 26 by anchoring and pinning the grain boundaries and pores 32 of the TBC 26.

While the above discussion is directed to columnar TBC of the type represented by FIG. 2, the benefits of the invention may also be achieved with noncolumnar TBC, as when deposited by such methods as plasma spraying. As previously discussed, a plasma-sprayed TBC is deposited as molten "splats" that produces a grain structure characterized by irregular flattened grains surrounded by inhomogeneous porosity. With the present invention, an effective amount of porosity can be maintained to stabilize the TBC microstructure during high temperature excursions by co-depositing a powder of YSZ alloyed with ceria along with a powder of elemental carbon or carbon-based compounds. An example is by simultaneously spraying graphite and YSZ powders or spraying a graphite-coated YSZ powder. A carbon-containing gas would then be evolved and some of the existing open porosity closed during a subsequent thermal treatment that is sufficient to partially sinter the TBC. The process and result differ from that of U.S. Pat. No. 5,906,895 to Hamada et al., in that Hamada et al. teach forming a plasma-sprayed TBC that either contains splats of carbides or another high temperature compound, or is infiltrated with a feed gas to form a coating of carbides (or another high temperature compound) on the inter-splat boundaries of the TBC. Neither of these TBC"s could contain entrapped gas because of the open porous nature of the plasma-sprayed TBC.

In an investigation leading to this invention, TBC's were deposited by EBPVD on specimens formed of the superalloy René N5 on which a platinum aluminide (PtAl) bond coat had been deposited. Some of the specimens were coated by evaporating an ingot of 7% YSZ (zirconia stabilized by about 7 wt. % yttria) to deposit a conventional 7% YSZ TBC. Other specimens were coated by evaporating an ingot of 7% YSZ alloyed with about 16 weight percent ceria (7% YSZ+ceria). Finally, additional specimens were coated by co-evaporating separate ingots of graphite and either the 7% YSZ or the 7% YSZ+ceria material (the resulting materials of which are referred to below as 7% YSZ+C and 7% YSZ+C+ceria, respectively). The graphite ingots included a tungsten cap which, during EBPVD, forms a molten surface pool through which carbon evaporates in accordance with U.S. Pat. No. 5,296,274 to Movchan et al. Similar to EBPVD processes of the past, the specimens were loaded into a coating chamber so as to be supported above the ingot(s), and the chamber evacuated to achieve a partial vacuum of about $4.7 \times 10^{-4}$ to about $6.6 \times 10^{-4}$ Torr (about $6.3 \times 10^{-4}$ to about $8.8 \times 10^{-4}$ mbar). The specimens were then heated to a temperature of between about 900° C. and 1000° C., and then coated while being rotated at a rate of about 25 rpm. The 7% YSZ and 7% YSZ+ceria ingots were evaporated using electron beam guns operated at a power level of about 19.5 kW. When co-evaporating graphite, a second electron beam gun operated at a power level of about 23 kW was used to project a separate electron beam onto the graphite ingot. The TBC's were deposited to have thicknesses on the order of about 150 micrometers. The 7% YSZ+ceria and 7% YSZ+C+ceria coatings contained about 16 weight percent ceria, while each of the coatings produced by co-evaporating graphite (7% YSZ+C and 7% YSZ+C+ceria) contained a dispersion of carbon (solid graphite) and possibly zirconium carbide, which congregated at the defects, pores and sub-grains (interfaces within the grains) of the YSZ microstructure during growth of the individual grains. Following coating, all of the specimens underwent aging in air at about 1200° C. for about two hours.

Figure 3:
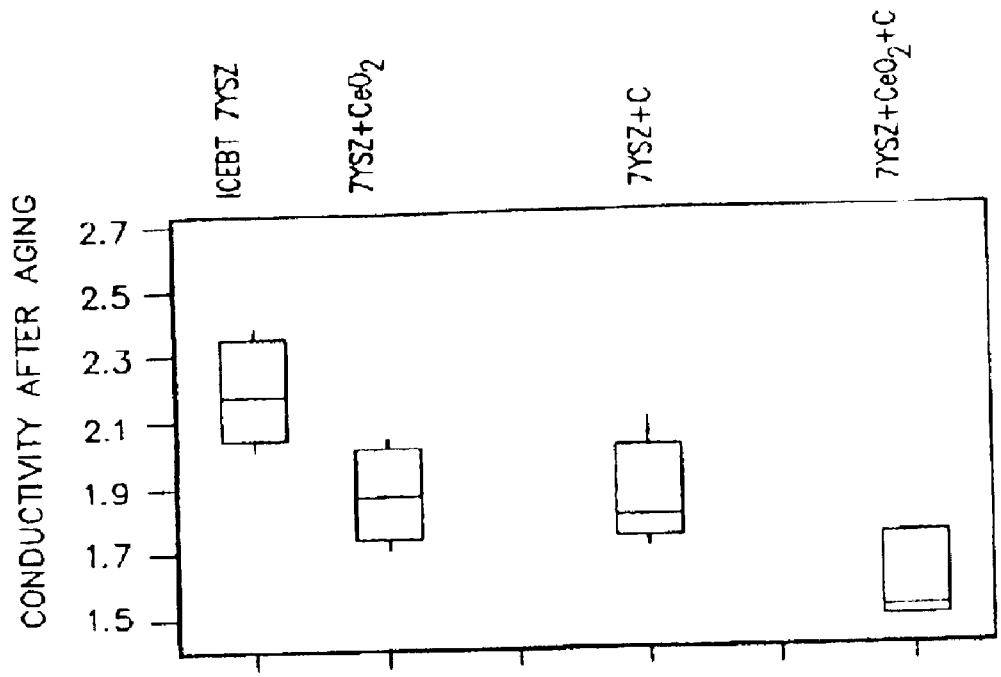
FIGS. 3 and 4 are graphs comparing the thermal conductivities and densities, respectively, of thermal barrier coatings formed in accordance with the prior art and the present invention.
Figure 4:
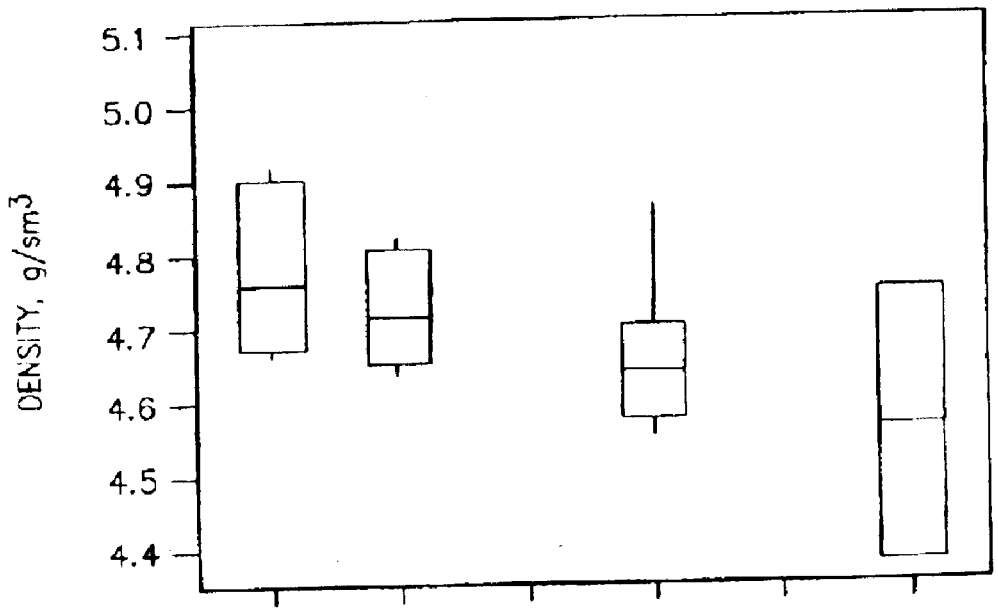

The thermal conductivities and densities for all of the specimens are summarized in the graphs of FIGS. 3 and 4, in which the ranges, standard deviations and averages are plotted. The thermal conductivities for the baseline 7% YSZ, 7% YSZ+ceria, 7% YSZ+C and 7% YSZ+C+ceria specimens were measured at about 890° C., and are tabulated in Table II below. The values for "% difference" are based on the average conductivities of the 7% YSZ+ceria, 7% YSZ+C and 7% YSZ+C+ceria specimens relative to the baseline 7% YSZ specimens.

TABLE II

| Specimen | Avg. (W/mK) | Std. Dev. | % Difference |
| --- | --- | --- | --- |
| 7% YSZ | 22 | 0.17 | – |
| 7% YSZ + ceria | 1.85 | 0.11 | −14.0 |
| 7% YSZ + C | 18 | 0.13 | −13.0 |
| 7% YSZ + C + ceria | 1.6 | 0.07 | −25.0 |

The results from this investigation strongly evidenced the individual and combined effects that carbon and ceria additions have on the porosity and thermal conductivity of a YSZ TBC, as well as the effect that carbon has on YSZ alloyed with ceria. The reduced thermal conductivities of the specimens containing elemental carbon were attributed to an increase in porosity observed in the as-deposited condition as well as additional porosity that developed following aging at 1200° C. The reduced thermal conductivities of the specimens containing ceria were attributed to the increased lattice strain energy resulting from ceria having an ion size which is 30 percent smaller than zirconium ions ($Zr^{4+}$), causing an increase in lattice strain energy of the TBC grains. Surprisingly, the combination of both carbon and ceria provided the greatest reduction in density, from an average of about 4.73 g/cm$^3$ for 7% YSZ to as low as about 4.38 g/cm$^3$ for 7% YSZ+C+ceria.

Finally, microhardness measurements before and after the aging step showed that the 7% YSZ specimens had hardnesses of about 6 GPa before and after aging, and the 7% YSZ+ceria specimens had hardnesses of about 4 GPa before and after aging. In contrast, hardness increased from about 2.8–3 GPa to about 5.8–6 GPa for the 7% YSZ+C+ceria specimens, evidencing that a reaction had occurred to considerably increase the hardnesses of the 7% YSZ+C+ceria specimens. Such results indicate that the manner in which carbon and YSZ alloyed with ceria were co-deposited and aged produced a ternary system of carbides and oxycarbides, and not simply a mixture of carbon, ceria and YSZ. In any event, the resulting material exhibited a hardness comparable to that of YSZ, indicating that equivalent erosion resistance could be expected. Such improved mechanical properties in combination with a thermal conductivity of about 25% less than YSZ evidenced a thermal-insulating material that is suitable as a TBC in the hostile environment within gas turbine engines.

While the invention has been described in terms of a preferred embodiment, it is apparent that other forms could be adopted by one skilled in the art. For example, instead of depositing the TBC by EBPVD, other atomic and molecular vapor deposition processes could be used, such as sputtering, ion plasma deposition, and all forms of melting and evaporation deposition processes. Accordingly, the scope of the invention is to be limited only by the following claims.

What is claimed is:

1. A thermal barrier coating on a surface of a component, the thermal barrier coating comprising a thermal-insulating material of yttria-stabilized zirconia alloyed with at least a third oxide having an absolute percent ion size difference relative to a zirconium ion of at least 13 percent, the third oxide being present in the thermal-insulating material in an amount sufficient to increase lattice strain energy of grains of the thermal barrier coating, the thermal barrier coating containing elemental carbon, carbides, oxycarbides and/or a carbon-containing gas.

2. A thermal barrier coating according to claim 1, wherein the third oxide is selected from the group consisting of ceria, magnesia, calcia, strontia, barium oxide, lanthana, neodymia, gadolinium oxide, dysprosia, ytterbia and tantala.

3. A thermal barrier coating according to claim 2, wherein the thermal-insulating material is alloyed with an additional oxide selected from the group consisting of ceria, magnesia, calcia, strontia, barium oxide, lanthana, neodymia, gadolinium oxide, dysprosia, ytterbia and tantala.

4. A thermal barrier coating according to claim 1, wherein the third oxide is ceria.

5. A thermal barrier coating according to claim 4, wherein the thermal-insulating material contains about 10 to about 20 weight percent ceria, the balance essentially zirconia stabilized by about 4 to about 8 yttria.

6. A thermal barrier coating according to claim 1, wherein the elemental carbon, carbides, oxycarbides and/or carbon-containing gas are within pores that are within grains and at and between grain boundaries of the thermal-insulating material.

7. A thermal barrier coating according to claim 6, wherein at least some of the pores contain elemental carbon.

8. A thermal barrier coating according to claim 6, wherein at least some of the pores entrap the carbon-containing gas.

9. A thermal barrier coating according to claim 8, wherein the carbon-containing gas is at least one gas chosen from the group consisting of carbon monoxide and carbon dioxide.

10. A thermal barrier coating according to claim 6, wherein at least some of the pores contain the elemental carbon, at least some of the pores contain carbides or oxycarbides, and at least some of the pores entrap the carbon-containing gas.

11. A thermal barrier coating according to claim 1, wherein the microstructure of the thermal barrier coating consists of columnar grains so that the microstructure is columnar, or flattened grains so that the microstructure is noncolumnar and inhomogeneous.

12. A thermal barrier coating on a surface of a superalloy component, the thermal barrier coating comprising:
a bond coat on the component;
a thermal-insulating material of yttria-stabilized zirconia alloyed with about 10 to about 20 weight percent ceria, the thermal insulating material having a columnar microstructure with pores and sub-grain interfaces within, at and between grain boundaries of the microstructure, at least some of the pores containing elemental carbon, carbides, oxycarbides, and/or a carbon-containing gas.

13. A thermal barrier coating according to claim 12, wherein at least some of the pores contain the elemental carbon, at least some of the pores contain carbides or oxycarbides, and at least some of the pores entrap the carbon-containing gas.

14. A thermal barrier coating according to claim 12, wherein the thermal-insulating material comprises a ternary reaction product of ceria and the elemental carbon.

15. A thermal barrier coating according to claim 14, wherein the ternary reaction product comprises carbides and/or oxycarbides.

* * * * *